(12) United States Patent
Udagawa

(10) Patent No.: US 7,772,599 B2
(45) Date of Patent: Aug. 10, 2010

(54) GALLIUM NITRIDE-BASED SEMICONDUCTOR STACKED STRUCTURE, PRODUCTION METHOD THEREOF, AND COMPOUND SEMICONDUCTOR AND LIGHT-EMITTING DEVICE EACH USING THE STACKED STRUCTURE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 157 days.

(21) Appl. No.: 11/597,565

(22) PCT Filed: May 25, 2005

(86) PCT No.: PCT/JP2005/010012
§ 371 (c)(1),
(2), (4) Date: Feb. 20, 2007

(87) PCT Pub. No.: WO2005/117078
PCT Pub. Date: Dec. 8, 2005

(65) Prior Publication Data
US 2008/0067522 A1 Mar. 20, 2008

Related U.S. Application Data

(60) Provisional application No. 60/577,576, filed on Jun. 8, 2004.

(30) Foreign Application Priority Data
May 27, 2004 (JP) .............................. 2004-157132

(51) Int. Cl.
*H01L 31/153* (2006.01)
*H01L 29/165* (2006.01)
(52) U.S. Cl. ................... 257/85; 257/96; 257/E21.365; 257/E21.366; 257/E21.367; 257/E21.368

(58) Field of Classification Search ................... 257/85, 257/96, E21.365–E21.368
See application file for complete search history.

(56) References Cited

U.S. PATENT DOCUMENTS 6,541,292 B2 * 4/2003 Van de Walle et al. ........ 438/22

(Continued)

FOREIGN PATENT DOCUMENTS

JP 2-81484 3/1990

(Continued)

OTHER PUBLICATIONS

Isamu Akasaki; "Group III-V Compound Semiconductor—Advanced Electronics Series I-1, Category I: Electronic Material, Physical Characteristic, Device"; Baifukan Publishing Co., Ltd.; pp. 329-351 (1994).

*Primary Examiner*—Bradley K Smith
*Assistant Examiner*—Alexander Belousov
(74) *Attorney, Agent, or Firm*—Sughrue Mion, PLLC

(57) ABSTRACT

A gallium-nitride-based semiconductor stacked structure includes a low-temperature-deposited buffer layer and an active layer. The low-temperature-deposited buffer layer is composed of a Group III nitride material that has been grown at low temperature and includes a single-crystal layer in an as-grown state, the single-crystal layer being present in the vicinity of a junction area that is in contact with a (0001) (c) plane of a sapphire substrate. The active layer is composed of a gallium-nitride (GaN)-based semiconductor layer that is provided on the low-temperature-deposited buffer layer. The single-crystal layer is composed of a hexagonal $Al_xGa_yN$ ($0.5<X\leq1$, $X+Y=1$) crystal that contains aluminum in a predominant amount with respect to gallium such that a [2.−1.−1.0.] direction of the $Al_xGa_yN$ crystal orients along with a [2.−1.−1.0.] direction of the (0001) bottom plane of the sapphire substrate.

5 Claims, 2 Drawing Sheets

U.S. PATENT DOCUMENTS

| | | |
|---|---|---|
| 6,914,264 B2 | 7/2005 | Chen et al. |
| 2002/0137249 A1* | 9/2002 | Ishida et al. ................. 438/47 |
| 2004/0079948 A1 | 4/2004 | Chen et al. |

FOREIGN PATENT DOCUMENTS

| | | |
|---|---|---|
| JP | 2-288388 | 11/1990 |
| JP | 7-288231 | 10/1995 |
| JP | 10-107319 A | 4/1998 |
| JP | 10-321905 A | 12/1998 |
| JP | 11-162848 A | 6/1999 |
| JP | 11-186603 A | 7/1999 |
| JP | 2005-223126 A | 8/2005 |
| TW | 546859 B | 8/2003 |

* cited by examiner

GALLIUM NITRIDE-BASED SEMICONDUCTOR STACKED STRUCTURE, PRODUCTION METHOD THEREOF, AND COMPOUND SEMICONDUCTOR AND LIGHT-EMITTING DEVICE EACH USING THE STACKED STRUCTURE

CROSS REFERENCE TO RELATED APPLICATIONS

This application is an application filed under 35 U.S.C.§111(a) claiming the benefit pursuant to 35 U.S.C.§119(e)(1) of the filing dates of Provisional Application No. 60/577,576 filed Jun. 8, 2004 and Japanese Patent Application No. 2004-157132 filed May 27, 2004 pursuant to 35 U.S.C.§111(b).

TECHNICAL FIELD

The present invention relates to a gallium-nitride-based semiconductor stacked structure having a specific low-temperature-deposited buffer layer (i.e., buffer layer formed at relatively low temperature) advantageous for enhancing orientation characteristics of a gallium-nitride-based Group III-V compound semiconductor layer, to a method for producing the stacked structure, and to a compound semiconductor device and a light-emitting device each using the stacked structure.

BACKGROUND ART

Conventionally, gallium nitride (GaN)-based Group III-V compound semiconductors of cubic zinc-blende crystal type or Wurtzite crystal type are employed for fabricating semiconductor devices, such as a light-emitting device emitting visible light of short wavelength (see, for example, JP-A HEI 2-288388).

Stacked structures for fabricating gallium-nitride-based semiconductor devices are produced by use of a single-crystal substrate composed of a high-heat-resistance aluminum oxide, such as sapphire ($\alpha$-$Al_2O_3$ single crystal) or a garnet solid single-crystal (see, for example, JP-A HEI 7-288231).

The above single-crystal substrate composed of aluminum oxide (e.g., sapphire) has lattice constants considerably different from those of a gallium nitride (GaN)-based semiconductor material.

Thus, the stacked structure for use in fabrication of gallium-nitride-based semiconductor devices is generally formed on a single-crystal substrate by the mediation of a buffer layer. The buffer layer for relaxing mismatch in terms of lattice constants is generally called a "low-temperature-deposited buffer layer," since the layer has been conventionally formed at relatively low temperature (see, for example, Book written by Isamu AKASAKI, "Group III-V Compound Semiconductors," published by Baifukan Co., Ltd., 1st edition, Chapter 13, (May 20, 1995)).

The low-temperature-deposited buffer layer is formed from, for example, aluminum nitride (AlN) (see the aforementioned Book). In order to relax lattice constant mismatch with respect to a crystalline substrate, the low-temperature-deposited buffer layer is preferably formed of a polycrystalline material in as-grown state (see, for example, JP-A HEI 2-81484).

Meanwhile, there has been disclosed another technique for forming a low-temperature-deposited buffer layer employing a single-crystal layer formed in as-grown state serving at junction area with respect to a crystalline substrate (see, for example, JP-A HEI 10-321905).

However, the low-temperature-deposited buffer layer formed on a sapphire substrate has a drawback in that the orientation of the single-crystal layer included in the buffer layer is not sufficiently identical on the surface of the sapphire substrate, thereby failing to attain consistent formation, on the substrate, of a GaN-based Group III nitride semiconductor layer having the identically same orientation and excellent single-crystal characteristics.

Thus, an object of the present invention is to provide a specific crystal feature of a single-crystal layer included in a low-temperature-deposited buffer layer such that, on an $Al_XGa_YN$ (0<X,Y<1, X+Y=1) low-temperature-deposited buffer layer including a single-crystal layer being present in the vicinity of a junction area that is in contact with a sapphire substrate, a gallium-nitride-based semiconductor layer having excellent single-crystal characteristics is suitably formed. Another object of the invention is to provide a stacked structure having a GaN-based nitride semiconductor layer having excellent crystallinity, the layer being formed from a low-temperature-deposited buffer layer including a single-crystal layer having the above crystal feature. Yet another object of the invention is to provide a compound semiconductor device exhibiting excellent characteristics by virtue of employment of the stacked structure.

DISCLOSURE OF THE INVENTION

In order to attain the aforementioned objects, a first aspect of the invention provides a gallium-nitride-based semiconductor stacked structure comprising a low-temperature-deposited buffer layer composed of a Group III nitride material that has been grown at low temperature and that include a single-crystal layer in as-grown state, the single-crystal layer being present in the vicinity of a junction area that is in contact with a (0001) (c) plane of a sapphire substrate, and an active layer composed of a gallium-nitride (GaN)-based semiconductor layer that is provided on the low-temperature-deposited buffer layer, wherein the single-crystal layer included in the low-temperature-deposited buffer layer in as-grown state is composed of a hexagonal $Al_XGa_YN$ (0.5<X≦1, X+Y=1) crystal that contains aluminum (Al) in a predominant amount with respect to gallium (Ga) such that a [2.−1.−1.0.] direction of the $Al_XGa_YN$ crystal orients along with a [2.−1.−1.0.] direction of the (0001) bottom plane of the sapphire substrate.

According to the present invention, there is provided a low-temperature-deposited buffer layer formed on a sapphire substrate and including a single-crystal layer of a junction area being in contact with the substrate, wherein the single-crystal layer is composed of a hexagonal $Al_XGa_YN$ (0.5<X≦1, X+Y=1) single crystal, containing Al in a predominant amount with respect to Ga, such that the [2.−1.−1.0.] direction of the $Al_XGa_YN$ crystal coincides with the a-axis of the sapphire substrate, thereby attaining a well-unified orientation.

In a second aspect of the invention, the gallium-nitride-based semiconductor stacked structure according to the first aspect further comprises a thin-film layer provided between the low-temperature-deposited buffer layer and the active layer and composed of a GaN-based Group III nitride semiconductor containing indium (In) or aluminum (Al).

A third aspect of the invention provides the gallium-nitride-based semiconductor stacked structure according to the second aspect, wherein the thin-film layer composed of GaN-based Group III nitride semiconductor containing indium (In) or aluminum (Al) has a layer thickness of 2 nm to 100 nm.

In a fourth aspect of the invention, the gallium-nitride-based semiconductor stacked structure according to any one of the first to third aspects further comprises a superlattice structure provided between the low-temperature-deposited buffer layer and the active layer and having a thin-film layer composed of a GaN-based Group III nitride semiconductor containing indium (In) or aluminum (Al).

A fifth aspect of the invention provides the gallium-nitride-based semiconductor stacked structure according to any one of the second to fourth aspects, wherein the thin-film layer composed of a GaN-based Group III nitride semiconductor containing indium (In) or aluminum (Al) or the superlattice structure layer having the thin-film layer is provided between the active layer and an aluminum gallium indium nitride ($Al_\alpha Ga_\beta In_{1-\alpha-\beta}N$: $0 \leq \alpha$, $\beta \leq 1$, $0 \leq \alpha+\beta \leq 1$) layer provided on the low-temperature-deposited buffer layer.

A sixth aspect of the invention provides the gallium-nitride-based semiconductor stacked structure according to any one of the second to fifth aspects, wherein the orientation of the thin-film layer composed of a GaN-based Group III nitride semiconductor containing indium (In) or aluminum (Al) coincides with that of the single-crystal layer included in the low-temperature-deposited buffer layer.

A seventh aspect of the invention provides a method for producing a gallium-nitride-based semiconductor stacked structure comprising the steps of forming on a (0001) (c) plane of a sapphire substrate an $Al_X Ga_Y N$ low-temperature-deposited buffer layer which is composed of a hexagonal single-crystal layer serving as a junction area which is in contact with the substrate, at a growth temperature of 250° C. to 500° C., such that the single-crystal layer included in the low-temperature-deposited buffer layer in as-grown state is composed of a hexagonal $Al_X Ga_Y N$ ($0.5 < X \leq 1$, $X+Y=1$) crystal which contains aluminum (Al) in a predominant amount with respect to gallium (Ga) and whose [2.-1.-1.0.] direction orients along with a [2.-1.-1.0.] direction of the (0001) bottom plane of the sapphire substrate, and subsequently, forming a gallium-nitride (GaN)-based semiconductor layer serving as an active layer on the buffer layer.

An eighth aspect of the invention provides a compound semiconductor device fabricated from the stacked structure according to any one of the first to sixth aspects.

A ninth aspect of the invention provides a light-emitting device fabricated from the stacked structure according to any one of the first to sixth aspects.

The gallium-nitride-based semiconductor stacked structure according to the first aspect of the invention has a low-temperature-deposited buffer layer composed of a Group III nitride material, which has been grown at low temperature and which includes a single-crystal layer in as-grown state, the single-crystal layer being present in the vicinity of a junction area that is in contact with a (0001) (c) plane of a sapphire substrate, and a gallium-nitride (GaN)-based semiconductor layer provided on the low-temperature-deposited buffer layer. In the stacked structure, the low-temperature-deposited buffer layer is provided on the surface of the substrate and includes a single-crystal layer composed of a hexagonal $Al_X Ga_Y N$ ($0.5 < X \leq 1$, $X+Y=1$) crystal in as-grown state, and having a well-unified orientation such that the [2.-1.-1.0.] direction of the $Al_X Ga_Y N$ crystal coincides with the [2.-1.-1.0.] direction of the (0001) sapphire substrate. On the low-temperature-deposited buffer layer, an active layer composed of a GaN-based semiconductor layer is provided. Therefore, a stacked structure can be advantageously fabricated from a GaN-based semiconductor layer having a well-unified orientation and excellent single-crystal characteristics.

In the gallium-nitride-based semiconductor stacked structure according to the second aspect of the invention, a thin-film layer composed of a GaN-based Group III nitride semiconductor is provided between the low-temperature-deposited buffer layer and the active layer. Thus, a stacked structure having a high-quality light-emitting layer can be produced for use in light-emitting devices, such as a light-emitting diode (LED) and a laser diode (LD). In addition, the thin-film layer is capable of forming, as an upper layer provided thereon, an active layer having excellent crystallinity with few misfit dislocations.

According to the third aspect of the invention, the thickness of the thin-film layer is regulated. Thus, a high-quality active layer can be reliably produced.

In the gallium-nitride-based semiconductor stacked structure according to the fourth aspect of the invention, a superlattice structure layer including a GaN-based Group III nitride semiconductor thin-film layer is provided between the low-temperature-deposited buffer layer and the active layer. Thus, a stacked structure having a high-quality light-emitting layer can be produced for use in light-emitting devices, such as a light-emitting diode (LED) and a laser diode (LD).

According to the fifth aspect of the invention, the aforementioned thin-film layer or superlattice structure layer is provided between the active layer and the $Al_\alpha Ga_\beta In_{1-\alpha-\beta}N$ ($0 \leq \alpha$, $\beta \leq 1$, $0 \leq \alpha+\beta \leq 1$) layer provided on the low-temperature-deposited buffer layer. Thus, an active layer having a highly flat surface can be readily produced.

According to the sixth aspect of the invention, the orientation of the GaN-based Group III nitride semiconductor thin-film layer coincides with that of the single-crystal layer included in the low-temperature-deposited buffer layer. Therefore, deformation which would otherwise be caused due to difference in orientation can be prevented. Thus, a high-quality active layer having few misfit dislocations can be remarkably and readily produced.

According to the seventh aspect of the invention, the aforementioned gallium-nitride-based semiconductor stacked structure of the first aspect can be readily produced. Specifically, a continuous single-crystal layer that sufficiently and homogeneously covers the sapphire substrate can be formed. Through controlling the growth temperature to fall within 350° C. to 450° C., a low-temperature-deposited buffer layer having a crystal orientation of a specific direction can be formed. Furthermore, through controlling the growth rate to fall in the range of 1 nm/min to 3 nm/min, the buffer layer can be formed more effectively and reliably.

According to the eighth or ninth aspect of the invention, a compound semiconductor device or a light-emitting device is fabricated from a stacked structure including a GaN-based semiconductor single-crystal layer having a well-unified orientation. The invention is applicable to provision of semiconductor devices, such as a light-emitting diode exhibiting excellent emission characteristics; i.e., causing few local breakdowns in the reverse voltage direction.

The above and other objects, characteristic features and advantages will become apparent to those skilled in the art from the description given herein below with reference to the accompanying drawings.

BEST MODES FOR CARRYING OUT THE INVENTION

Figure 1:
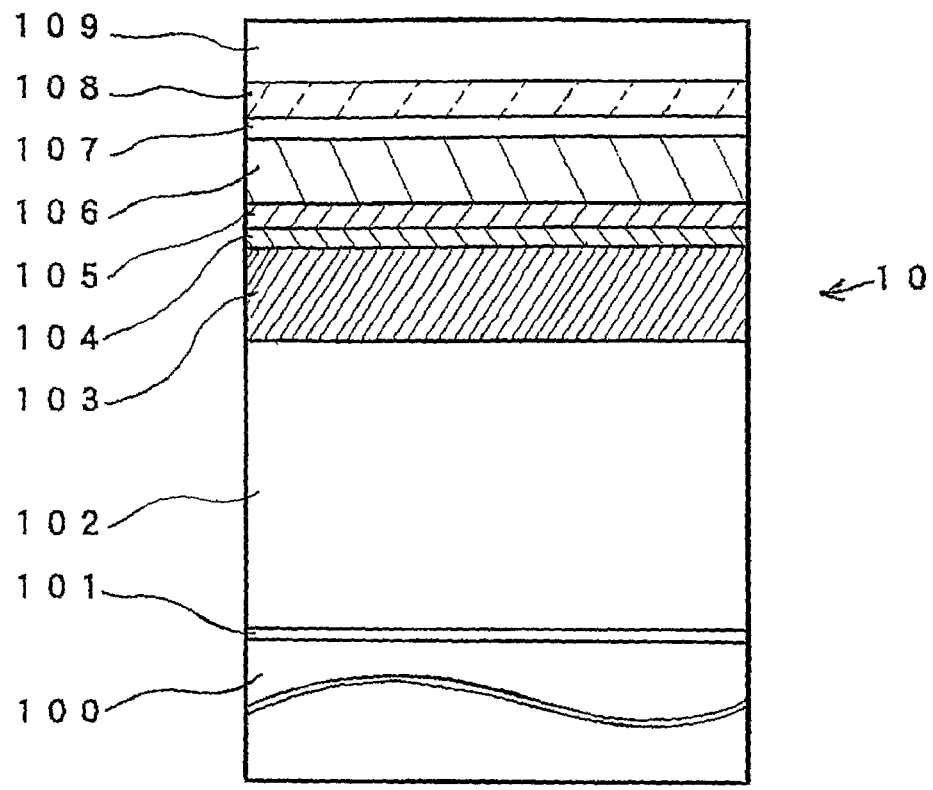
FIG. 1 is a schematic cross-section of the GaN-based semiconductor stacked structure of Example 1.

The $Al_XGa_YN$ low-temperature-deposited buffer layer is formed on a sapphire substrate through, for example, a metal-organic chemical vapor deposition (abbreviated as MOCVD) means. For example, an $Al_XGa_YN$ layer is formed through the MOCVD means by use of a metal-organic (MO) compound, such as trimethylaluminum ($(CH_3)_3Al$), trimethylgallium ($(CH_3)_3Ga$) or triethylgallium ($(C_2H_5)_3Ga$) as a source. Ammonia ($NH_3$) or a similar compound may be used as a nitrogen source. Triisobutylaluminum ($(i-C_4H_9)_3Al$) and hydrazines, which are thermally decomposed at lower temperatures, may also be employed as sources for growing the low-temperature-deposited buffer layer.

When an $Al_XGa_YN$ low-temperature-deposited buffer layer including a hexagonal single-crystal layer serving as a junction portion is formed on a sapphire substrate, particularly on a (0001) plane (i.e., c plane) thereof, the growth temperature is essentially controlled so as to fall within an appropriate range. Specifically, the growth temperature is preferably controlled to 250° C. to 500° C. When the growth temperature is lower than 250° C., formation of the $Al_XGa_YN$ low-temperature-deposited buffer layer is unsatisfactorily attained due to insufficient thermal decomposition of growth sources, whereas when the growth temperature is higher than 500° C., a large number of columnar crystals grow at random, thereby failing to reliably form a continuous single-crystal layer that sufficiently and homogeneously covers the substrate surface.

In the present invention, a single-crystal layer can be formed to serve as a junction portion with respect to the substrate in as-grown state of the low-temperature-deposited buffer layer. Therefore, even when the single crystal layer is placed under high temperature conditions in a subsequent film formation step or a device fabrication step, the crystal structure of the single-crystal layer is maintained. In other words, the present invention defines the crystal structure of the low-temperature-deposited buffer layer in as-grown state, which means that the invention also defines the final crystal structure of the low-temperature-deposited buffer layer after fabrication of devices.

More preferably, the $Al_XGa_YN$ low-temperature-deposited buffer layer is grown at 350° C. to 450° C. When the growth temperature falls within this temperature range, the formed low-temperature-deposited buffer layer is composed of an $Al_XGa_YN$ crystal having a specific orientation. Particularly when the low-temperature-deposited buffer layer is formed from an $Al_XGa_YN$ ($0.5<X\leq1$, $X+Y=1$) crystal containing aluminum in a predominant amount with respect to gallium, the formed low-temperature-deposited buffer layer contains a single-crystal layer composed of $Al_XGa_YN$ ($0.5<X\leq1$, $X+Y=1$), such that the a-axis of the $Al_XGa_YN$ crystal coincides with the a-axis of the c-plane of the sapphire substrate. Whether or not the formed layer is a single-crystal layer may be determined on the basis of appearance of diffraction spots in an electron diffraction image. When a halo or a ring diffraction image appears, the formed layer can be determined to be amorphous or polycrystalline.

When the growth rate is regulated to 1 nm/min to 3 nm/min, the $Al_XGa_YN$ ($0.5<X\leq1$, $X+Y=1$) low-temperature-deposited buffer layer including a single-crystal layer whose orientation is well-unified with respect to a specific crystal axis of the sapphire substrate can be formed more effectively and reliably. The growth rate is controlled by modifying the amount per unit time (supply rate) of a Group III element (e.g., aluminum) source supplied to a reaction system for growing the low-temperature-deposited buffer layer. Thus, when the amount of aluminum or gallium supplied to the growth reaction system or the total amount thereof is increased, the growth rate can be increased. In the case where the concentration of aluminum exceeds that of gallium during supply of aluminum and gallium to the growth reaction system, a low-temperature-deposited buffer layer composed of an $Al_XGa_YN$ ($0.5<X\leq1$, $X+Y=1$) crystal containing Al in a predominant amount with respect to Ga can be formed.

The orientation feature of the single-crystal layer included in the low-temperature-deposited buffer layer and present at a junction area being in contact with the sapphire substrate may be determined through, for example, electron diffraction method. Specifically, an electron diffraction pattern of the $Al_XGa_YN$ low-temperature-deposited buffer layer with respect to an incident electron beam parallel to the [2.−1.−1.0.] direction (a-axis) of sapphire serving as a substrate is captured. When a reciprocal-lattice image of the $Al_XGa_YN$ low-temperature-deposited buffer layer as viewed from a direction of [2.−1.−1.0.] appears in the electron diffraction pattern, the $Al_XGa_YN$ single-crystal layer included in the low-temperature-deposited buffer layer is determined such that the [2.−1.−1.0.] direction (a-axis) of the $Al_XGa_YN$ crystal orients along with the [2.−1.−1.0.] direction (a-axis) of the (0001) sapphire (see P. Hirsch et al., "ELECTRON MICROSCOPY OF THIN CRYSTAL," Krieger Pub. Com. (1977, U.S.A.)).

The $Al_XGa_YN$ low-temperature-deposited buffer layer of the present invention may be formed of a single-crystal layer in its entirety or may include a single-crystal layer exclusively in a junction area that is in contact with the sapphire substrate.

Examples of the latter case include the case in which an amorphous $Al_XGa_YN$ is present in as-grown state on the single-crystal layer included in the low-temperature-deposited buffer layer. The feature may be observed in a cross-ssection TEM (transmission electron microscope) image. Such an amorphous semiconductor is known to be crystallized, when a GaN-based semiconductor layer is grown at a temperature higher than the temperature (250° to 500° C.) at which the low-temperature-deposited buffer layer has been grown on the low-temperature-deposited buffer layer. In the above case, since the single-crystal layer having the aforementioned well-unified orientation is present to serve as a base layer, the unified orientation feature is reflected to the amorphous semiconductor, which is advantageous for transforming the amorphous semiconductor to the corresponding crystal having the unified orientation. Specifically, the single-crystal layer that is present in the junction area which is in contact with the surface of the sapphire substrate can also be effectively used for transforming an amorphous semiconductor contained in the low-temperature-deposited buffer layer to the corresponding crystal having the unified orientation, which is similar to the case in which an active layer composed of a GaN-based semiconductor layer has an excellent well-unified orientation and excellent single-crystal characteristics.

The single-crystal layer present in the junction area which is in contact with the surface of the sapphire substrate has a thickness of at least 1 nm and may be composed of a single-crystal layer as mentioned above. In the single-crystal layer, constituent atoms (i.e., aluminum, gallium and nitrogen) are chemically bonded tightly with one another and adhere strongly to the sapphire substrate. Therefore, despite the layer thickness being about 1 nm, the single-crystal layer remains on the surface of the sapphire substrate even when the layer is placed under high-temperature conditions under which the GaN-based semiconductor layer has been formed on the low-temperature-deposited buffer layer. As a result, exposure of the surface of the sapphire substrate is prevented, and the GaN-based semiconductor layer having a well-unified orientation is advantageously formed as an upper layer.

The GaN-based semiconductor layer which is formed on the low-temperature-deposited buffer layer so as to serve as an active layer is typically a GaN-based Group III nitride semiconductor layer. The semiconductor layer may be formed through a known vapor growth means, such as the halogen method, the hydride method or MOCVD, or through molecular beam epitaxy.

For example, on the low-temperature-deposited buffer layer of the aforementioned structure, the following GaN-based Group III nitride semiconductor layers a) to f) are sequentially stacked, whereby a GaN-based semiconductor stacked structure suitable for fabricating a light-emitting diode can be formed.

a) Germanium (Ge)-doped n-type GaN layer
b) Superlattice structure composed of a Ge-doped n-type GaN layer and an n-type gallium indium nitride ($Ga_{Y1}In_{Z1}N$: $0<Z1\leqq1$, $Y1+Z1=1$) layer
c) Quantum well (QW) structure composed of an n-type GaN layer and an n-type $Ga_{Y2}In_{Z2}N$ ($0<Z2\leqq1$, $Z1\neq Z2$, $Y2+Z2=1$) layer
d) Superlattice structure composed of $Al_{X1}Ga_{Y1}N$ ($0\leqq X1$, $Y1\leqq1$, $X1+Y1=1$) layer and $Ga_{Y3}In_{Z3}N$ ($0<Z3\leqq1$, $Z1\neq Z3$, $Y3+Z3=1$) layer
e) p-Type $Al_{X2}Ga_{Y2}N$ ($0\leqq X2$, $Y2\leqq1$, $X1\neq X2$, $X2+Y2=1$) layer
f) p-Type GaN layer The GaN-based Group III nitride semiconductor layers a) to f) may be grown through different means. However, all the layers, including a low-temperature-deposited buffer layer, are preferably grown through a single means (e.g., MOCVD) from the viewpoint of production of such a stacked structure.

Instead of the aforementioned p-type Group III nitride semiconductor layer e) or the p-type layers e) and f), a p-type Group III-V semiconductor layer may be stacked to form a stacked structure. In this case, a boron-phosphide-based semiconductor layer or a similar layer may serve as the p-type Group III-V semiconductor layer. Particularly, use of boron monophosphide (BP) having a lattice spacing equivalent to the a-axis (=0.319 nm) of GaN is advantageous for producing a stacked structure having a p-type layer well matched with GaN.

The compound semiconductor device of the present invention is fabricated by appropriately processing the aforementioned GaN-based semiconductor stacked structure and forming electrodes and other elements. For example, the uppermost layer of the aforementioned GaN-based semiconductor stacked structure composed of the aforementioned p-type GaN layer f) is employed as a contact layer on which an Ohmic electrode is formed. On the aforementioned n-type Group III nitride semiconductor layer a) or b), an Ohmic electrode of the opposite polarity is provided. Through provision of these electrodes in such a manner, the n-type Group III nitride semiconductor layer a) or b) serves as an n-type cladding layer, the quantum well structure c) serves as a light-emitting layer, and the p-type Group III nitride semiconductor layer d) or e) serves as a p-type cladding layer. A pn-junction double-hetero (DH) structure LED is fabricated from the layers.

In the present invention, the constituent layers included in the GaN-based semiconductor stacked structure are grown by the mediation of a low-temperature-deposited buffer layer including a single-crystal layer having a well-unified orientation. Thus, each layer assumes the form of a single-crystal layer having a particularly unified orientation; i.e., having no crystal grain boundaries. In addition, the single-crystal layer included in the low-temperature-deposited buffer layer grown on the sapphire substrate has a surface crystal plane having characteristics identical with those of the surface of the sapphire substrate. Accordingly, a low-temperature-deposited buffer layer including a single-crystal layer having a (0001) crystal plane forming a surface is provided on a sapphire substrate having a (0001) plane forming the surface. Thus, an upper Group III nitride semiconductor layer comes to have a surface crystal having an identical orientation. Through employment of such a stacked structure, the aforementioned LED is fabricated. In this case, unnecessary leak current caused by crystal grain boundaries which are formed through, for example, aggregation of crystal grains having different orientations, can be reduced, and the LED exhibits excellent electrical properties.

In the case in which a stacked structure for use in a light-emitting device, such as a light-emitting diode (LED) or a laser diode (LD), is formed, a thin-film layer composed of a GaN-based Group III nitride semiconductor containing indium (In) or aluminum (Al) or a superlattice structure layer including the thin-film layer may be interposed between the active layer (i.e., light-emitting layer) and the low-temperature-deposited buffer layer having the aforementioned structure, whereby a high-quality light-emitting layer can be produced. For example, a stacked structure is fabricated by forming a light-emitting layer on a low-temperature-deposited buffer layer by the mediation of a thin-film layer composed of an aluminum gallium nitride mixed crystal ($Al_QGa_{1-Q}N$: $0<Q\leqq1$).

Furthermore, the aforementioned GaN-based Group III nitride semiconductor thin-film layer interposed between the active layer and the low-temperature-deposited buffer layer can provide an upper active layer having excellent crystallinity with few misfit dislocations. In order to consistently provide a high-quality active layer, the thin-film layer preferably has a thickness of 2 nm to 100 nm. When the thickness of the thin-film layer is less than 2 nm, the surface of the lower layer (i.e., low-temperature-deposited buffer layer) cannot be covered sufficiently, which is not preferred, whereas when the thin-film layer has a thickness greater than 100 nm, a GaN-based Group III nitride semiconductor thin-film layer having a highly flat surface cannot be provided consistently. Particularly when the GaN-based Group III nitride semiconductor thin-film layer contains indium (In), surface roughness steeply increases when the thickness exceeds 100 nm. Thus, a thin-film layer having a highly flat surface is difficult to form.

Through interposing a superlattice structure layer including an n-type gallium indium nitride ($Ga_{Y1}In_{Z1}N$: $0<Z1\leqq1$, $Y1+Z1=1$) thin-film layer between the light-emitting layer and the GaN-based Group III nitride semiconductor thin-film layer provided on the low-temperature-deposited buffer layer, a stacked structure having a light-emitting layer for attaining high-intensity light emission can be fabricated. For example, a superlattice structure layer formed through alternately and repeatedly stacking $Ga_{Y2}In_{Z2}N$ ($0<Z2\leqq1$, $Z1\neq Z2$, $Y2+Z2=1$) thin-film layers having different indium (In) compositional proportions (=Z2) can suppress propagation of crystal defects, such as misfit dislocations, to an upper active layer.

Alternatively, $Al_\alpha Ga_\beta In_{1-\alpha-\beta}N$ ($0 \leq \alpha$, $\beta \leq 1$, $0 \leq \alpha+\beta \leq 1$) or a GaN-based Group III nitride semiconductor layer containing a non-nitrogen (N) Group V element, such as arsenic (As) or phosphorus (P), may be formed on a low-temperature-deposited buffer layer, and then the aforementioned thin-film layer or the superlattice structure layer may be formed on the semiconductor layer. In addition, an active layer may be further formed. In the above fashion, the GaN-based Group III nitride semiconductor layer is provided on the low-temperature-deposited buffer layer, and the aforementioned thin-film layer or the superlattice structure layer is provided between the semiconductor layer and the active layer, whereby an active layer having excellent surface flatness can be readily produced.

In the case in which the aforementioned single-crystal layer serving as the low-temperature-deposited buffer layer and the GaN-based Group III nitride semiconductor thin-film layer are formed of a single crystal and in which orientations of the two layers are matched with each other, a high-quality upper active layer having few misfit dislocations can be remarkably and readily formed. In other words, deformation due to mismatch in orientation can be prevented, thereby providing a high-quality active layer.

The single-crystal layer provided in as-grown state in a low-temperature-deposited buffer layer in a junction area that is in contact with the surface of a sapphire substrate can attain a well-unified orientation of a GaN-based Group III nitride semiconductor layer deposited on the low-temperature-deposited buffer layer.

EXAMPLE 1

The present invention will next be described in detail by way of Example 1. In Example 1, a GaN-based Group III nitride semiconductor layer was grown on a sapphire substrate by the mediation of a low-temperature-deposited buffer layer including a single-crystal layer to thereby fabricate a GaN-based semiconductor stacked structure 10.

FIG. 1 is a schematic cross-sectional view of the GaN-based semiconductor stacked structure 10 of Example 1.

Group III nitride semiconductor layers 102 to 109 included in the GaN-based semiconductor stacked structure 10 were formed on a (0001) surface of a sapphire substrate 100 by the mediation of a low-temperature-deposited buffer layer 101 composed of an aluminum gallium nitride mixed crystal ($Al_{0.90}Ga_{0.10}N$).

The low-temperature-deposited buffer layer 101 was grown through an atmospheric pressure (near atmospheric pressure) MOCVD by use of trimethylaluminum (($CH_3)_3Al$) as an aluminum (Al) source, trimethylgallium (($CH_3)_3Ga$) as a gallium source (Ga) and ammonia ($NH_3$) as a nitrogen (N) source at 420° C. Growth rate was adjusted to 2 nm/min by controlling the concentration of ($CH_3)_3Al$ supplied to the MOCVD reaction system per unit time. The thickness of the low-temperature-deposited buffer layer 101 was controlled to 15 nm.

Internal crystal structure of the low-temperature-deposited buffer layer 101 was analyzed in as-grown state through electron diffraction method. The diffraction pattern assumed a spot-like pattern, indicating that a layer-form single crystal was present in a portion from the (0001) surface of the sapphire substrate 100 to a thickness of about 5 nm. The electron diffraction pattern also indicated that the single-crystal layer was composed of a hexagonal crystal which was stacked on the (0001) surface of the sapphire substrate such that the (0001) plane of the hexagonal crystal and the (0001) surface of the sapphire substrate were aligned in the same direction. On the basis of the relationship between diffraction and incident direction of electron beam, the [2.−1.−1.0.] direction of the single-crystal layer coincided with the [2.−1.−1.0.] direction of the sapphire substrate 100. It was noted that amorphous substances having a height of about 10 nm were present discretely on the single-crystal layer.

On the $Al_{0.90}Ga_{0.10}N$ low-temperature-deposited buffer layer 101, the following GaN-based Group III nitride semiconductor layers (a) to (h) were sequentially grown through MOCVD to thereby fabricate a GaN-based semiconductor stacked structure of Example 1.

(a) Germanium (Ge)-doped n-type GaN layer (carrier concentration (n)=$1 \times 10^{18}$ cm$^{-3}$, layer thickness (t)=3,200 nm) 102

(b) Ge-doped n-type gallium indium nitride mixed crystal ($Ga_{0.95}In_{0.05}N$, n=$1 \times 10^{18}$ cm$^{-3}$, t=150 nm) 103

(c) Ge-doped n-type $Al_{0.10}Ga_{0.90}N$ layer (n=$6 \times 10^{17}$ cm$^{-3}$, t=12 nm) 104

(d) Ge-doped n-type GaN layer (t=10 nm) 105

(e) Quantum well structure layer 106 formed through alternate stacking of n-type GaN (t=15 nm) layers (two layers) and n-type $Ga_{0.95}In_{0.05}N$ (t=3 nm) layers (three layers)

(f) n-Type GaN layer (t=10 nm) 107 similar to n-type GaN layer 105

(g) p-Type $Al_{0.20}Ga_{0.80}N$ layer (carrier concentration (p)=$8 \times 10^{17}$ cm$^{-3}$, t=20 nm) 108

(h) p-Type $Al_{0.05}Ga_{0.95}N$ layer (carrier concentration (p)=$9 \times 10^{17}$ cm$^{-3}$, t=50 nm) 109

Since the aforementioned Group III nitride semiconductor layers (a) to (h) were grown by the mediation of the low-temperature-deposited buffer layer 101 including a single-crystal layer, all the grown layers assumed single-crystal layers. Through observation based on cross-section TEM, no amorphous substance was observed in the junction interface between the low-temperature-deposited buffer layer 101 and the n-type GaN layer 102 grown at a higher temperature of 1,100° C., indicating that the n-type GaN layer 102 was considered to grow so as to be directly joined to the single-crystal layer present in the low-temperature-deposited buffer layer 101 in as-grown state. Therefore, the amorphous substances scattered on the single-crystal layer present in the low-temperature-deposited buffer layer in as-grown state might be sublimated during deposition of the n-type GaN layer 102 at a high temperature of 1,100° C. In addition, since the Group III nitride semiconductor layers 102 to 109 were deposited on the low-temperature-deposited buffer layer 101 including a single-crystal layer having a well-unified orientation, all these layers were determined to be hexagonal single-crystal layers each having the [2.−1.−1.0.] direction that coincided with the [2.−1.−1.0.] direction of the sapphire substrate 100. Thus, a GaN-based semiconductor stacked structure including GaN-based Group III nitride semiconductor single-crystal layers each having a well-unified orientation and single-crystal characteristics was provided.

EXAMPLE 2

The present invention will next be described in detail by way of Example 2. In Example 2, a GaN-based Group III nitride semiconductor layer different from that of Example 1 was grown on a sapphire substrate by the mediation of a low-temperature-deposited buffer layer having a composition different from that employed in Example 1 to thereby fabricate a GaN-based semiconductor stacked structure 20.

Figure 2:
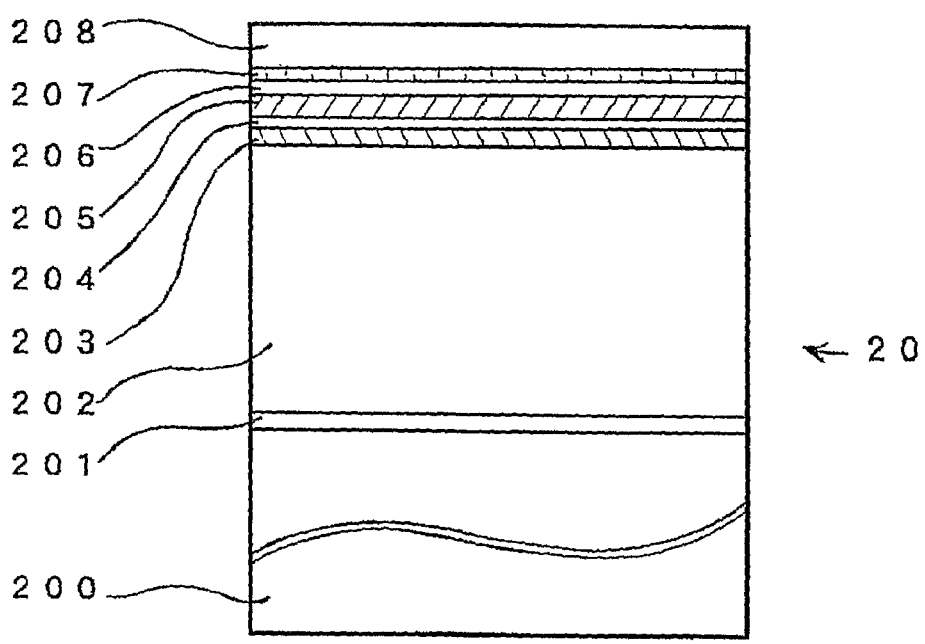
FIG. 2 is a schematic cross-section of the GaN-based semiconductor stacked structure of Example 2.

FIG. 2 is a schematic cross-sectional view of the GaN-based semiconductor stacked structure 20 of Example 2.

Group III nitride semiconductor layers 202 to 208 included in the GaN-based semiconductor stacked structure 20 were formed on a (0001) surface of a sapphire substrate 200 by the mediation of a low-temperature-deposited buffer layer 201 composed of aluminum nitride (AlN). The low-temperature-deposited buffer layer 201 was grown through a reduced-pressure MOCVD by use of tri(isobutyl)aluminum ((i-$C_4H_9)_3$ Al) as an aluminum (Al) source and ammonia ($NH_3$) as a nitrogen (N) source at 450° C. Growth rate was adjusted to 3 nm/min by controlling the concentration of (i-$C_4H_9)_3$Al supplied to the MOCVD reaction system per unit time.

Internal crystal structure of the low-temperature-deposited buffer layer 201 was analyzed in as-grown state through electron diffraction method. The diffraction pattern was a spot-like pattern, indicating that a layer of single crystal was present from the (0001) surface of the sapphire substrate 200 to a portion where the thickness of the layer reached up to 6 nm. The electron diffraction pattern also indicated that the single-crystal layer was composed of a hexagonal crystal which was stacked on the (0001) surface of the sapphire substrate such that the (0001) plane of the hexagonal crystal and the (0001) surface of the sapphire substrate were aligned in the same direction. On the basis the relationship between the diffraction pattern and the incident direction of electron beam, the [2.-1.-1.0.] direction of the single-crystal layer oriented along with the [2.-1.-1.0.] direction of the sapphire substrate 200. On the single-crystal layer, an amorphous substance having a generally circular or a hanging-bell-like cross-section were present discretely. The AlN low-temperature-deposited buffer layer 201 has a total thickness of about 45 nm including a single-crystal layer thickness (average thickness: 6 nm) and the height of the amorphous substance present thereon.

On the AlN low-temperature-deposited buffer layer 201, the following GaN-based Group III nitride semiconductor layers (i) to (o) were sequentially grown through MOCVD to thereby fabricate a GaN-based semiconductor stacked structure of Example 2.

(i) Germanium (Ge)-doped n-type GaN layer (carrier concentration (n)=$3\times10^{18}$ $cm^{-3}$, layer thickness (t)=4,000 nm) 202
(j) Superlattice structure layer 203 formed through alternate stacking of silicon (Si)-doped n-type gallium indium nitride mixed crystal ($Ga_{0.99}In_{0.01}N$, t=2 nm) layers (ten layers) and $Ga_{0.98}In_{0.02}N$ (t=2 nm) layers (ten layers) having an In composition different from those of the Si-doped layers
(k) Si-doped n-type GaN layer (n=$9\times10^{17}$ $cm^{-3}$, t=20 nm) 204
(l) Quantum well structure layer 205 formed through alternate stacking of n-type GaN (t=15 nm) layers (three layers) and n-type $Ga_{0.95}In_{0.05}N$ (t=3 nm) layers (four layers)
(m) Si-doped n-type GaN layer (n=$9\times10^{17}$ $cm^{-3}$, t=20 nm) 206
(n) Magnesium (Mg)-doped p-type $Al_{0.05}Ga_{0.95}N$ layer (carrier concentration (p)=$9\times10^{17}$ $cm^{-3}$, t=25 nm) 207
(o) Mg-doped p-type GaN layer (p=$9\times10^{17}$ $cm^{-3}$, t=80 nm) 208

Since the aforementioned Group III nitride semiconductor layers (i) to (o) were grown by the mediation of the low-temperature-deposited buffer layer 201 including a single-crystal layer, all the grown layers were single-crystal layers. In addition, since the Group III nitride semiconductor layers 202 to 208 were deposited on the low-temperature-deposited buffer layer 201 including a single-crystal layer having a well-unified orientation, all these layers were hexagonal single-crystal layers each having the [2.-1.-1.0.] direction (a-axis) along with the [2.-1.-1.0.] direction (a-axis) of the sapphire substrate 200.

EXAMPLE 3

The present invention will next be described in detail by way of Example 3, in which an LED 1A was fabricated from the GaN-based semiconductor stacked structure 10 of Example 1.

Figure 3:
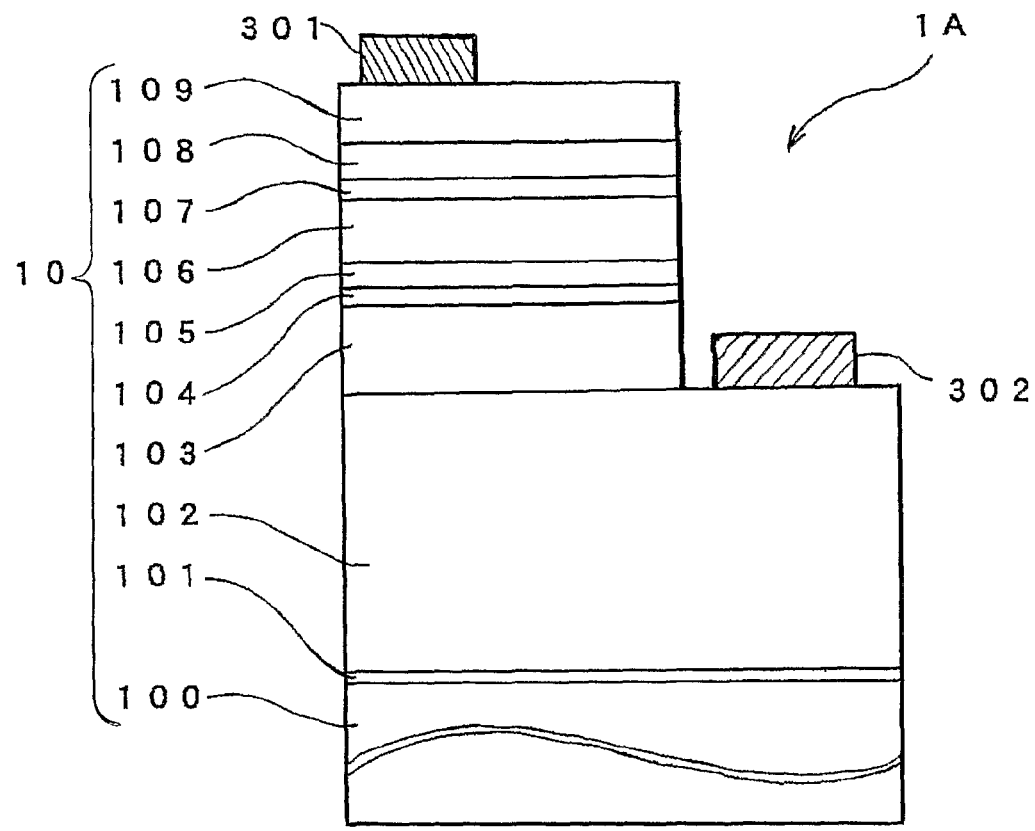
FIG. 3 is a schematic cross-section of the LED of Example 3.

FIG. 3 is a schematic cross-sectional view of the LED 1A of Example 3.

The GaN-based semiconductor stacked structure 10 of Example 1 was processed through a conventional plasma etching means, whereby a portion of the surface of the n-type GaN layer 102 provided by the mediation of the low-temperature-deposited buffer layer 101 was exposed, the portion being exclusively an area where an n-type Ohmic electrode 302 was to be provided. Subsequently, on the thus exposed surface of the n-type GaN layer 102, aluminum (Al)—vanadium (V) alloy film and Al film were sequentially stacked, thereby providing the n-type Ohmic electrode 302. On a corner portion of the p-type $Al_{0.05}Ga_{0.95}N$ layer 109 serving as a surface of the stacked structure 10, gold (Au)—chromium (Cr)—cobalt (Co) alloy film and Au—Cr alloy film were deposited, thereby forming a p-type Ohmic electrode 301.

Through the above procedure, there was fabricated an LED 1A having a pn-junction double-hetero (DH) structure including the GaN-based semiconductor stacked structure 10 of Example 1, which structure was composed of the n-type GaN layer 102 serving as an n-type cladding layer, the quantum well structure layer 107 (GaN layers/n-type $Ga_{0.95}In_{0.05}N$ layers) serving as a light-emitting layer, and the p-type $Al_{0.20}Ga_{0.80}N$ layer 109 serving as a p-type cladding layer.

Emission characteristics of the LED chips 1A were evaluated when forward device operation current (20 mA) was caused to flow between the n-type Ohmic electrode 302 and the p-type Ohmic electrode 301. The LED chips 1A were found to emit blue light having a center wavelength of 460 nm. The emission intensity of each chip before resin-molding, as determined through a typical integrating sphere, was as high as about 4 mW. The forward voltage (Vf) was found to be as low as 3.4 V. Since the n-type Ohmic electrode 302 and the p-type Ohmic electrode 301 were formed on a Group III nitride semiconductor layer having excellent crystallinity by the mediation of the low-temperature-deposited buffer layer 101 including a single-crystal layer having a well-unified orientation in as-grown state, the LED chips exhibited little local breakdown. Thus, the reverse voltage at a reverse current of 10 μA was found to be higher than 15 V.

EXAMPLE 4

The present invention will next be described in detail by way of Example 4, in which an LED 2A was fabricated from the GaN-based semiconductor stacked structure 20 of Example 2.

Figure 4:
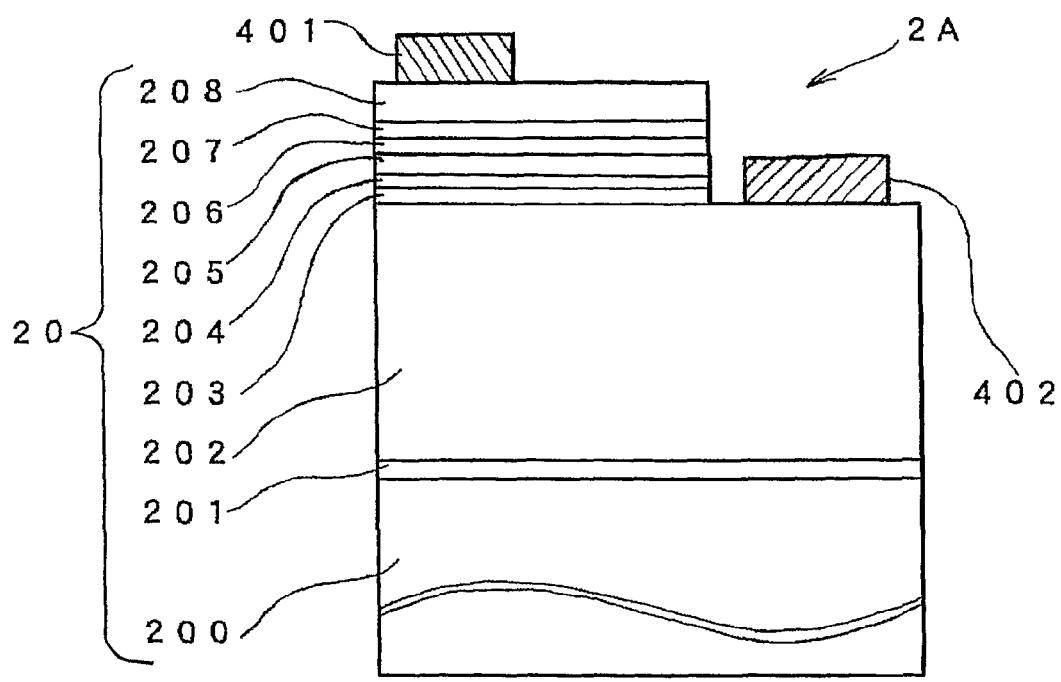
FIG. 4 is a schematic cross-section of the LED of Example 4.

FIG. 4 is a schematic cross-sectional view of an LED 2A of Example 4.

As described in Example 3, the GaN-based semiconductor stacked structure 20 of Example 2 was processed through a conventional plasma etching means, whereby a portion of the surface of the n-type GaN layer 202 provided by the mediation of the low-temperature-deposited buffer layer 201 was exposed, the portion being exclusively an area where an n-type Ohmic electrode 402 was to be provided. Subsequently, on the thus exposed surface of the n-type GaN layer 202, Al film and tungsten (W)-titanium (Ti) alloy film were sequentially stacked, thereby providing the n-type Ohmic electrode 402. On a corner portion of the p-type GaN layer 208 serving as a surface of the stacked structure 20, an oxide film containing Al, Au, gallium (Ga), nickel (Ni) and oxygen (O) was deposited, thereby forming a p-type Ohmic electrode 401.

Through the above procedure, there was fabricated an LED 2A having a pn-junction double-hetero (DH) structure including the GaN-based semiconductor stacked structure 20 of Example 2, which structure was composed of the n-type GaN layer 202 serving as an n-type cladding layer, the quantum well structure layer 205 (n-type GaN/n-type $Ga_{0.95}In_{0.05}N$) serving as a light-emitting layer, and the p-type $Al_{0.05}Ga_{0.95}N$ layer 207 serving as a p-type cladding layer.

Emission characteristics of the LED chips 2A were evaluated when forward device operation current (20 mA) was caused to flow between the n-type Ohmic electrode 402 and the p-type Ohmic electrode 401. The LED chips 2A were found to emit blue light having a center wavelength of 455 nm. The emission intensity of each chip before resin-molding, as determined through a typical integrating sphere, was as high as about 3 mW. The forward voltage (Vf) was found to be as low as 3.5 V. Since the n-type Ohmic electrode 402 and the p-type Ohmic electrode 401 were formed on a Group III nitride semiconductor layer having excellent crystallinity by the mediation of the low-temperature-deposited buffer layer 201 including a single-crystal layer having a well-unified orientation in as-grown state, the LED chips exhibited little local breakdown. Thus, the reverse voltage at a reverse current of 10 μA was found to be about 15 V.

INDUSTRIAL APPLICABILITY

The semiconductor stacked structure of the present invention is a promising candidate for a stacked structure for use in a variety of light-emitting devices, such as a light-emitting diode (LED) and a laser diode (LD).

The invention claimed is:
1. A gallium-nitride-based semiconductor stacked structure comprising:
   a low-temperature-deposited buffer layer composed of a Group III nitride material that has been grown at low temperature and that includes a single-crystal layer in as-grown state, the single-crystal layer being present in the vicinity of a junction area that is in contact with a (0001) (c) plane of a sapphire substrate;
   an active layer composed of a gallium-nitride (GaN)-based semiconductor layer that is provided on the low-temperature-deposited buffer layer; and
   a thin-film layer provided between the low-temperature-deposited buffer layer and the active layer and composed of a GaN-based Group III nitride semiconductor containing indium or aluminum having a layer thickness of 2 nm to 100 nm;
   wherein the single-crystal layer included in the low-temperature-deposited buffer layer in as-grown state is composed of a hexagonal $Al_xGa_yN$ ($0.5 < X \leq 1$, $X+Y=1$) crystal that contains aluminum in a predominant amount with respect to gallium such that a [2.-1.-1.0.] direction of the $Al_xGa_yN$ crystal orients along with a [2.-1.-1.0.] direction of the (0001) bottom plane of the sapphire substrate.

2. The gallium-nitride-based semiconductor stacked structure according to claim 1, further comprising a superlattice structure provided between the low-temperature-deposited buffer layer and the active layer and having a thin-film layer composed of a GaN-based Group III nitride semiconductor containing indium or aluminum.

3. The gallium-nitride-based semiconductor stacked structure according to claim 2, wherein the thin-film layer composed of a GaN-based Group III nitride semiconductor containing indium or aluminum or the superlattice structure layer having the thin-film layer is provided between the active layer and an aluminum gallium indium nitride ($Al_\alpha Ga_\beta In_{1-\alpha-\beta}N$: $0 \leq \alpha, \beta \leq 1$, $0 \leq \alpha+\beta \leq 1$) layer provided on the low-temperature-deposited buffer layer.

4. The gallium-nitride-based semiconductor stacked structure according to claim 1, wherein the orientation of the thin-film layer composed of a GaN-based Group III nitride semiconductor containing indium or aluminum coincides with that of the single-crystal layer included in the low-temperature-deposited buffer layer.

5. The gallium-nitride-based semiconductor stacked structure according to claim 2, wherein the superlattice structure is fabricated by stacking, alternately and repeatedly, $Ga_{Y1}In_{Z1}N$ ($0 < Z1 \leq 1$, $Y1+Z1=1$) thin film layers and $Ga_{Y2}In_{Z2}N$ ($0 < Z2 \leq 1$, $Z1 \neq Z2$, $Y2+Z2=1$) thin film layers.

* * * * *